United States Patent [19]

Voorman

[11] 4,431,976
[45] Feb. 14, 1984

[54] ADAPTIVE FILTER

[75] Inventor: Johannes O. Voorman, Eindhoven, Netherlands

[73] Assignee: U.S. Philips Corporation, New York, N.Y.

[21] Appl. No.: 319,502

[22] Filed: Nov. 9, 1981

[30] Foreign Application Priority Data

Dec. 2, 1980 [NL] Netherlands .......................... 8006543

[51] Int. Cl.³ ............................................. H03H 15/00
[52] U.S. Cl. .................................. 333/166; 333/17 R; 333/174
[58] Field of Search ...................... 333/17 R, 18, 28 R, 333/165, 166, 174; 328/167; 179/170.2

[56] References Cited

U.S. PATENT DOCUMENTS 3,732,410 5/1973 Mackechnie ................... 333/28 R X
4,038,536 7/1977 Feintuch ........................... 333/166 X Primary Examiner—Marvin L. Nussbaum
Attorney, Agent, or Firm—Thomas A. Briody; William J. Streeter; Edward W. Goodman

[57] ABSTRACT

In order to make an adaptive filter, having a delay circuit, (3) taps of which include amplitude control circuits (43, 45, 47, 49, 51, 53, 55, 57) which are controlled by an error signal (output of 149), more suitable for use in television receivers, a number of said amplitude control circuits (45, 55) are controlled by both the error signal (output from 149, 151, 125 and 153, 127 respectively) and an inverse version of a signal corrected by the filter (output 119, 121, 125 and 123, 127 respectively).

7 Claims, 2 Drawing Figures

ADAPTIVE FILTER

BACKGROUND OF THE INVENTION

The invention relates to an adaptive filter comprising a delay circuit, taps of which are connected to amplitude control circuits, a difference-determining circuit for forming an error signal between a signal which is corrected by the filter and a reference signal having a waveform which substantially corresponds to a desired waveform for the signal corrected by the filter, circuits for obtaining control signals for the amplitude control circuits being controlled by means of said error signal.

Nachrichten Technische Zeitschrift 1971, volume 1, pages 18-24 discloses an adaptive filter of the above-mentioned type. Such a filter is suitable for use in television receivers if the automatic adjustment of the filter is effected in response to a teletext signal present in the television signal as a data signal in one or more line periods during the vertical picture blanking period and which may be used as a pseudo-random test signal for the filter.

SUMMARY OF THE INVENTION

The invention has for its object to make such an adaptive filter still more suitable for use in television receivers.

According to the invention, an adaptive filter of the type defined in the opening paragraph is therefore characterized in that a number of the circuits for obtaining the control signals for the amplitude control circuits are further inversely controlled by a signal corrected by the filter.

By the measure in accordance with the invention, when the filter is used to correct a receiver television signal besides, for example, by the periodically occurring bivalent teletext signal, a number of the amplitude control circuits are now continuously adjusted by the analog television signal, as a result of which an improved echo-suppression is obtained.

DESCRIPTION OF THE DRAWINGS

The invention will now be further described by way of example, with reference to the embodiments in the accompanying drawings.

In the drawings.

DESCRIPTION OF THE PREFERRED EMBODIMENTS

Figure 1:
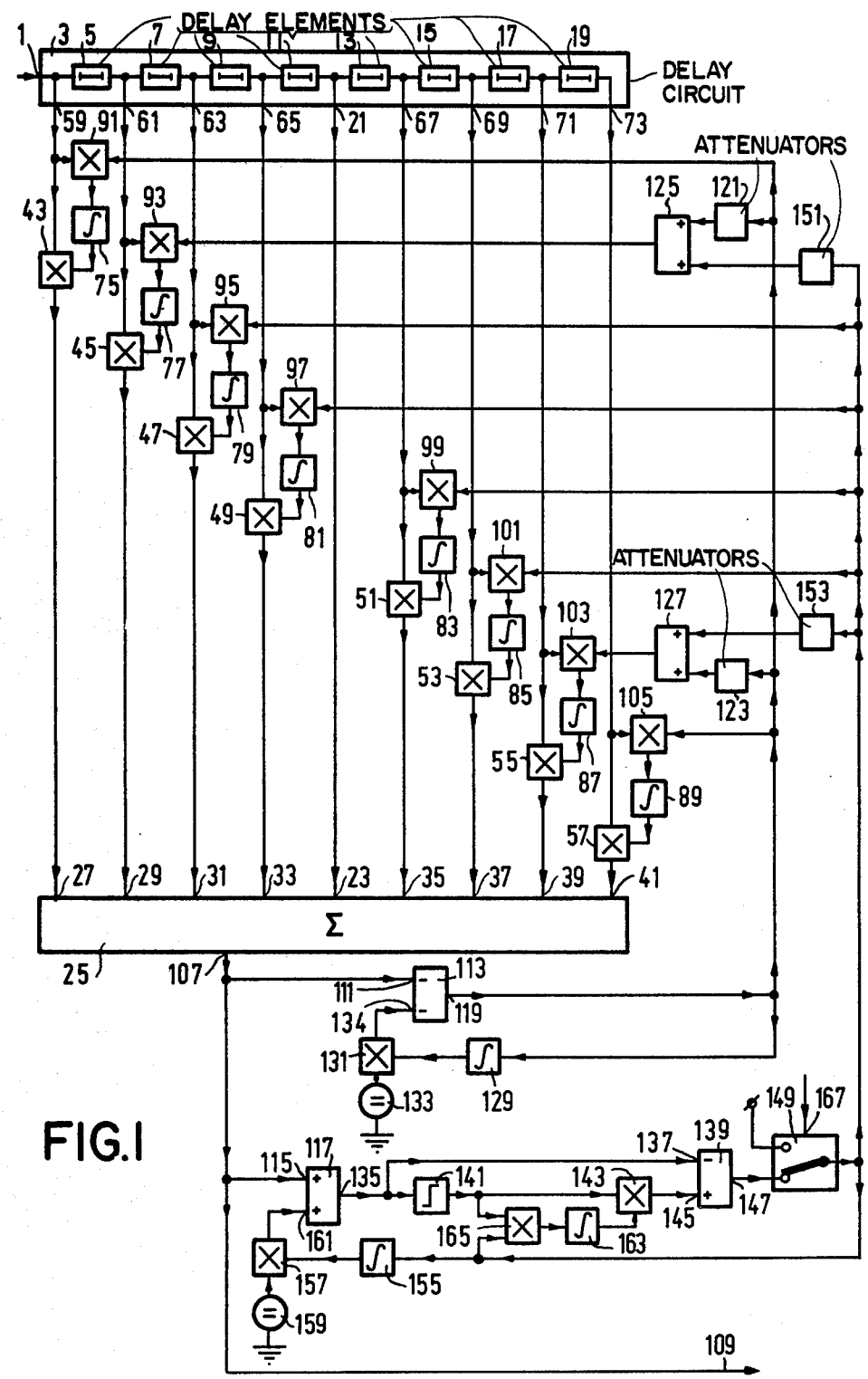
FIG. 1 shows a block schematic circuit diagram of an adaptive filter according to the invention and FIG. 2 shows a concise block schematic circuit diagram of a further possible construction of an adaptive filter in accordance with the invention.

In FIG. 1, a telesvision signal, comprising a bivalent data signal, for example a teletext signal which occurs in a number of line periods of the field blanking period and further comprising analog picture and synchronizing signals, is applied to an input 1 of a delay circuit 3.

The delay circuit 3 comprises a number of seriesarranged delay elements 5, 7, 9, 11, 13, 15, 17 amd 19, each having a time delay approximately equal to 1/2f, wherein f is the highest frequency in the television signal, which is usually 5 mHz.

A center tap 21 of the delay circuit is connected to an input 23 of an adder circuit 25, further inputs 27, 29, 31, 33, 35, 37, 39 and 41, respectively, of which are connected to further taps 59, 61, 63, 65, 69, 71 and 73, respectively, of the delay circuit 3 via amplitude control circuits 43, 45, 47, 49, 51, 53, 55 and 57, respectively, which are in the form of multipliers.

Via integrators 75, 77, 79, 81, 83, 85, 87 and 89, respectively, the amplitude control circuits 43, 45, 47, 49, 51, 53, 55 and 57 receive respective control signals from circuits 91, 93, 95, 97, 101, 103 and 105, respectively, which are in the form of a multipliers each of said circuits receiving an input signal from the taps 59, 61, 63, 65, 67, 69, 71 and 73, respectively, of the delay circuit 3.

At an output 107 of the adder circuit 25, there appears a signal in which, under the control of the amplitude control circuits 43, 45, 47, 49, 51, 53, 55 and 57, echoes have been cancelled and which will be designated the signal corrected by the filter or a corrected signal in the further course of this description. Said corrected signal is provided at an output 109 of the filter and is further applied to an inverting input 111 of an adder circuit 113 and to an input 115 of an adder circuit 117. An inverse version of the corrected signal is produced at an output 119 of the adder circuit 113, said inverse version being applied to the multipliers 91 and 105 and, via attenuator 121 and 123, respectively, to adder circuits 125 and 127, respectively, which control the multipliers 93 and 103, respectively.

Any d.c. component in the corrected signal at the output 119 of the adder circuit 113 is cancelled by an integrator 129 which is connected to said output 119 and which controls an amplifier 131, a further input of which is connected to a direct current signal source 133, and an output of which being connected to a further inverting input 134 of the adder circuit 113.

An output 135 of the adder circuit 117 is connected to an inverting input of an adder circuit 139, which is employed as a difference-determining circuit, and is also connected to a further input 145 of the adder circuit 139 via a slicer 141 and a multiplier 143. During the occurrence of the teletext signal, the waveform of the signal at the further input 145 of the adder circuit 139 substantially corresponds to the desired waveform of the signal corrected by the filter so that at an output 147 of the difference-determining circuit 139, an error signal is produced which is applied to the multipliers 95, 97, 99 and 101 via a change-over switch 149, and also to a further input of the adder circuits 125 and 127, respectively, via attenuators 151 and 153, respectively. The error signal is further applied to an integrator 155 which controls a multiplier 157, a further input of which is connected to direct current signal source 159 and an output of which applies, to a further input 161 of the adder circuit 117, a direct current signal which suppresses the d.c. component in the signal at the output 135 of the adder circuit 117.

The multiplier 143 determines the amplitude of the signal at the input 145 of the difference-determining circuit 139 in response to a control signal obtained from a multiplier 165 via an inverting integrator 163, the error signal and a signal which is limited on both sides by the slicer 141 being applied to said multiplier 165.

Under the control of a control signal applied to an input 167 of the change-over switch 149, said switch 149 is, during the occurrence of the teletext signal which is used as the data test signal, in the position shown in the drawing and during the remaining portion of the time in the position not shown, so that in said remaining portion of the time the error signal becomes zero and the integrators 77, 79, 81, 83, 85, 87, 155 and 163 are not influenced.

So the circuits 91 and 105, respectively, for obtaining a control signal for the amplitude control circuits 43 and 57, respectively, are only controlled by an inverse version of the signal corrected by the filter, the circuits 93 and 103, respectively, for obtaining a control signal for the amplitude control circuits 45 and 55, respectively, are controlled by the inverse version of the corrected signal, and by the error signal and the circuits 95, 97, 99 and 101, respectively, for obtaining a control signal for the amplitude control circuits 47, 49, 51 and 53, respectively, are only controlled by the error signal.

In that event, the sum of the attenuations of the attenuators 121 and 151, and also of the attenuators 123 and 153 is unity and the attenuation of each of said attenuators has been chosen equal to one-half. If so desired, other values may be opted for.

The influence of the error signal on the amplitude control circuits decreases according as these circuits are provided in a tap of the delay circuit which is further removed from the center tap while the influence of the inverse of the corrected signal does increase. The signals at the taps in the region of the center tap show too strong a correlation with the signal on the center tap, also in the absence of echos. In addition, this signal auto-correlation cannot be distinguished from correlation of nearby echos. Therefore, the amplitude control circuits in said taps cannot be properly controlled by the inverse version of the corrected signal. Said amplitude control circuits are, however, very suitable for the control by means of the error signal as nearby echos in this error signal are very disturbing.

In order to prevent unwanted correlations, such as, for example, of a color carrier, a filter may be included in the output 119.

It will be obvious that according as shorter-distance pre-echos may be expected, a larger portion of the circuit to the left of the center tap may be omitted as may be the case at shorter-distance post-echos to the right of the center tap. In contrast therewith, further-distance echos require an extension of the circuit.

The direct current compensation at the inputs 134 and 161, respectively, of the adder circuits 114 and 117, respectively, is not necessary for the use of the measure in accordance with the invention and may, if so desired, be omitted. The application thereof is particularly advantageous for integrated circuits having direct current couplings between several stages, as a result of which unwanted direct current components may easily occur.

It will further be obvious that the number of amplitude control circuits which are influenced by both the error signal and the inverted corrected signal may be increased.

A more gradual transition from purely error signal-controlled amplitude control circuits to purely inverse corrected signal-controlled amplitude control circuits as regards the error signal percentage with respect to the corrected signal percentage may, if so desired, be used.

Figure 2:
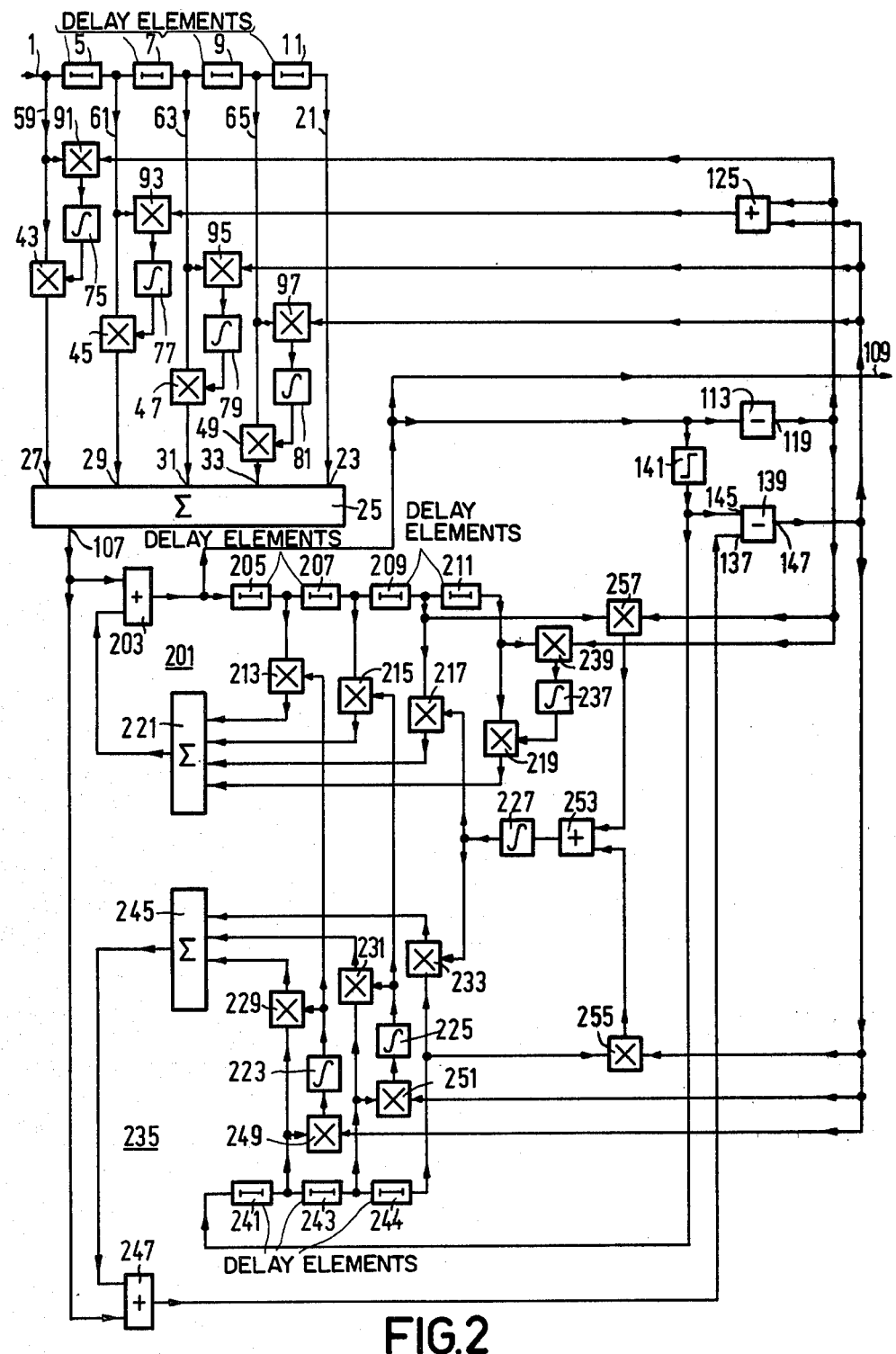

In FIG. 2 components corresponding with these in FIG. 1 are given the same reference numeral. For the description reference is made to the description of FIG. 1. In this case the delay elements 13, 15, 17 and 19 and the associated amplitude control circuits 51, 53, 55 and 57 have been omitted so that only pre-echos are compensated in the adder circuit 23.

Furthermore, for the sake of clarity, the circuits 129, 133, 131 and 155, 159, 157, which provide direct current compensation, and also the attenuators 121, 151, the amplitude control circuit 165, 163, 143 and the change-over switch 149 of FIG. 1 are not shown.

A recursive portion 201 is now included between the output 107 of the adder circuit 25 and the inputs of the adder circuit 113 shown now as an inverter, which inputs are connected to outputs 109 and the slicer 141. This recursive portion 201 comprises an adder circuit 203, a number of delay elements 205, 207, 209 and 211, a number of amplitude control circuits 213, 215, 217, and 219, connected to the outputs of said delay elements, and an adder circuit 221, which is connected to the outputs of said amplitude control circuits 213, 215, 217 and 219 the output of which is connected to a further input of the adder circuit 203.

The amplitude control circuits 213, 215 and 217, respectively, receive from three integrators 223, 225 and 227, respectively, the same control signals as three amplitude control circuits 229, 231 and 233, respectively, receive from a transversal filter 235. The amplitude control circuit 219 receives a control signal from an integrator 237, an input of which is connected to an output of a multiplier 239, an input of said multiplier 239 being connected to an output of the delay element 211 and a further input to the output 119 of the inverter circuit 113 for receiving an inverted signal which is corrected by the filter.

In addition, the transversal filter 235 has a number of delay elements 241, 243 and 244, an adder circuit 245 and an adder circuit 247. The inputs of the adder circuit 245 are connected to the outputs of the amplitude control circuits 229, 231 and 233 and the output of the adder circuit 245 is connected to an input of the adder circuit 247, a further input of which being connected to the output 107 of the adder circuit 25. So the adder circuit 247 receives the output signal of the transversal filter 235 from the output of the adder circuit 245 and the input signal of the recursive portion 201, which is the output signal of the adder circuit 25. The output of the adder circuit 247 is connected to the input 137 of the difference-determining circuit 139, from the output 147 of which the error signal is received. The reference signal obtained from the output of the slicer 141 is applied to an input of the delay element 241 which forms the input of the transversal filter 235. Said reference signal is the signal which is also applied to the input 145 of the difference-determining circuit 139 and in which the data signal has virtually the desired waveform.

The integrators 223, 225 and 227, respectively, receive a signal from an output of multipliers 249 and 251, respectively, and an adder circuit 253. The adder circuit 253 receives a signal from an output of a multiplier 255 and from an output of a multiplier 257.

The output signal of the delay element 241 along with the error signal are applied to the multiplier 249, the output signal of the delay element 243 and the error signal to the multiplier 251, the output signal of the delay element 244 and the error signal to the multiplier 255 and the output signal of the delay element 209 of the recursive portion 201 and the inverted signal from the output 119 of the inverter circuit 113 are applied to the multiplier 257.

At the output of the adder circuit 247 of the transversal filter 235, there is produced, in response to the action of the control system comprising the amplitude control circuits 229, and 233 a correction signal which, via the combining circuit 139, corrects the signal at the output 107 of the adder circuit 25 to form a signal which becomes equal, to the best possible extent, to the signal at the output of the slicer 141. As the recursive portion 201 comprises amplitude control circuits 213, 215 and 217, which are controlled in the same manner as the amplitude control circuits 229, 231 and 233 of the transversal filter 235, this correction signal is also obtained at the output of the adder circuit 221 and makes the waveform of the signal at the output of the adder circuit 203 substantially equal to that at the output of the adder circuit 247. In addition, the recursive portion 201 corrects higher order echos which cannot be corrected by a transversal filter. No control circuit which is difficult to stabilize is required for that purpose in the recursive portion.

In addition to the amplitude control circuits 213, 215 and 217 of the recursive portion 201 which are controlled in an identical manner as the amplitude control circuits 229, 231 and 233 of the transversal filter 235, the recursive portion 201 includes the amplitude control circuit 219 which is provided behind a delay element 211, which does not have a corresponding element in the transversal filter 235. This amplitude control circuit 219 is employed for the suppression of further-distance echos and recieves its control signal from the integrator 237, which is connected to the output of the multiplier 239, which is only controlled by the output signal of the relevant delay element 211 and the inverted signal from the output 119 of the inverter circuit 113.

Although the drawing shows, for this case only, one delay element 211 of this type with its associated amplitude control circuit 219, a larger number of delay elements with associated amplitude control circuits, which are controlled in the same way by the inverted signal may optionally be included in the recursive portion behind the delay element 211 to suppress further-distance echos.

The adder circuits 203, 221 and 245, 247 are shown separately in the drawing to make the operation of the circuit easier to understand. It will be obvious that if so desired, the adder circuit 203 may be combined with the adder circuit 221 and the adder circuit 245 may be combined with the adder circuit 247.

What is claimed is:

1. An adaptive filter comprising a delay circuit to which a signal to be corrected is applied, said delay circuit having a plurality of serially arranged delay elements having taps at respective outputs thereof, amplitude control circuits connected to said taps, an adder circuit coupled to respective outputs of said amplitude control circuits for forming a signal corrected by said filter, a difference-determining circuit for forming an error signal between a signal corrected by said filter and a reference signal having a waveform which substantially corresponds to a desired waveform for the signal corrected by said filter, and circuits for generating control signals for a number of said amplitude control circuits, said generating circuits being controlled by said error signal, characterized in that said generating circuits are further controlled by an inverse version of the signal corrected by said filter.

2. An adaptive filter as claimed in claim 1, characterized in that said filter further comprises a first plurality of further amplitude control circuits having circuits for generating a control signals for another number of said amplitude control circuits, said first plurality of further amplitude control circuits being only controlled by a signal from the relevant tap and by the error signal, and a second plurality of further amplitude control circuits having circuits for generating a control signal for an additional number of said amplitude control circuits, said second plurality of further amplitude control circuits being only controlled by a signal from the relevant tap and by the inverse version of the signal corrected by said filter.

3. An adaptive filter as claimed in claim 1 or 2, characterized in that said filter further comprises a circuit for suppressing a direct current component in the inverse version of the signal corrected by said filter for the control of the circuits for generating control signals for the amplitude control circuits.

4. An adaptive filter as claimed in claim 1 or 2, characterized in that said filter further comprises a recursive portion having a delay circuit with a plurality of serially arranged delay elements having taps at respective outputs thereof and amplitude control circuits connected respectively to said taps, and an adaptive transversal filter having a delay circuit with a plurality of serially arranged delay elements having taps at respective outputs thereof and amplitude control circuits connected respectively to said taps, said adaptive transversal filter further having circuits for generating control signals for said amplitude control circuits and also for a number of said amplitude control circuits in said recursive portion, said generating circuits being coupled to receive the signals at the respective taps of said adaptive transversal filter delay circuit, said reference signal being applied to said adaptive transversal filter delay circuit while said error signal is formed from said reference signal and the sum of an output signal of said adaptive transversal filter and an input signal of said recursive portion, which input signal is the output signal of said adder circuit.

5. An adaptive filter as claimed in claim 4, characterized in that said recursive portion further comprises at least one circuit for generating control signals for at least one of said amplitude control circuits in said recursive portion, said generating circuit being controlled by the inverse version of the signal corrected by said filter and a signal from the relevant tap of the delay circuit in the recursive portion.

6. An adaptive filter as claimed in claim 3, characterized in that said filter further comprises a recursive portion having a delay circuit with a plurality of serially arranged delay elements having taps at respective outputs thereof and amplitude control circuits connected respectively to said taps, and an adaptive transversal filter having a delay circuit with a plurality of serially arranged delay elements having taps at respective outputs thereof and amplitude control circuits connected respectively to said taps, said adaptive transversal filter further having circuits for generating control signals for said amplitude control circuits and also for a number of said amplitude control circuits in said recursive portion, said generating circuits being coupled to receive the signals at the respective taps of said adaptive transversal filter delay circuit, said reference signal being applied to said adaptive transversal filter delay circuit while said error signal is formed from said reference signal and the sum of an output signal of said adaptive transversal filter and an input signal of said recursive portion, which input signal is the output signal of said adder circuit.

7. An adaptive filter as claimed in claim 6, characterized in that said recursive portion further comprises at least one circuit for generating control signals for at least one of said amplitude control circuits in said recursive portion, said generating circuit being controlled by the inverse version of the signal corrected by said filter and a signal from the relevant tap of the delay circuit in the recursive portion.

* * * * *